United States Patent [19]

Peng et al.

[11] Patent Number: 5,666,309
[45] Date of Patent: Sep. 9, 1997

[54] MEMORY CELL FOR A PROGRAMMABLE LOGIC DEVICE (PLD) AVOIDING PUMPING PROGRAMMING VOLTAGE ABOVE AN NMOS THRESHOLD

[75] Inventors: Jack Zezhong Peng, San Jose; Jonathan Lin, Milpitas; Chris Schmidt, Sunnyvale, all of Calif.

[73] Assignee: Advanced Micro Devices, Inc., Sunnyvale, Calif.

[21] Appl. No.: 560,038

[22] Filed: Nov. 17, 1995

[51] Int. Cl.$^6$ .................................................. G11C 11/34
[52] U.S. Cl. .................. 365/185.08; 365/185.18; 365/185.24
[58] Field of Search .................. 365/185.08, 185.24, 365/185.18, 185.25

[56] References Cited

U.S. PATENT DOCUMENTS

| | | | |
|---|---|---|---|
| 4,460,979 | 7/1984 | Brahmbhatt | 365/185.08 |
| 4,831,589 | 5/1989 | Brahmbhatt | 365/189.09 |
| 4,885,719 | 12/1989 | Brahmbhatt | 365/182 |
| 5,272,368 | 12/1993 | Turner et al. | 257/315 |
| 5,331,590 | 7/1994 | Josephson et al. | 365/182 |

FOREIGN PATENT DOCUMENTS

| | | |
|---|---|---|
| A 0 295 935 | 12/1988 | European Pat. Off. . |
| A 0 414 434 A2 | 2/1991 | European Pat. Off. . |

*Primary Examiner*—Joseph A. Popek
*Attorney, Agent, or Firm*—Fliesler, Dubb, Meyer & Lovejoy

[57] ABSTRACT

A memory cell for a programmable logic device (PLD) and method for programming the memory cell. The memory cell includes components typically found in a memory cell for a PLD including an NMOS transistor having a floating gate, and two capacitors coupled to the floating gate, one capacitor being a tunneling capacitor enabling charge to be added to and removed from the floating gate. The memory cell further includes an NMOS pass gate transistor for supplying charge to the tunneling capacitor, but unlike conventional NMOS pass gates, it has a reduced threshold so that during programming when a programming voltage is applied to its drain, it can be turned on with an identical programming voltage applied to its gate, rather than requiring that its gate voltage be pumped above its drain voltage during programming. The reduced threshold can be obtained by removing the vt implant and punch through implant normally provided in its channel, or by other means.

2 Claims, 2 Drawing Sheets

MEMORY CELL FOR A PROGRAMMABLE LOGIC DEVICE (PLD) AVOIDING PUMPING PROGRAMMING VOLTAGE ABOVE AN NMOS THRESHOLD

BACKGROUND OF THE INVENTION

1. Field of the Invention

The present invention relates to programmable memory cells. More particularly, the present invention relates to programmable memory cells utilized in a programmable logic device (PLD).

2. Description of the Related Art

FIG. 1 shows a circuit diagram for a conventional programmable memory cell utilized in PLDs. The memory cell of FIG. 1 includes an NMOS transistor 100 having a floating gate enabling the memory cell to be programmable. The source of NMOS transistor 100 is shown connected to a product term ground (PTG) node. The PTG node provides a connection to a similar PTG input of a sense amplifier in a PLD. The dashed line in transistor 100 indicates that additional arsenic ion implantation is utilized in its channel to reduce its threshold to approximately zero volts so that no voltage drop occurs from the source to drain of transistor 100. Without the additional arsenic ion implantation, transistor 100 would have an NMOS threshold which is significantly higher than zero volts.

The drain of transistor 100 is connected to a product term (PT) node through the source to drain path of NMOS pass transistor 108. The PT node provides a connection to a similar PT input of a sense amplifier in a PLD. A word line (WL) node voltage input is supplied to the gate of pass transistor 108 to enable or disable a path from the PT node to the source of transistor 100.

Capacitors 102 and 104 are utilized to add charge to and subtract charge from the floating gate of transistor 100. Capacitor 102 couples an array control gate (ACG) node voltage to the floating gate of transistor 100. Capacitor 104 is a tunneling capacitor which includes a thin tunneling oxide region. Charge is added to the floating gate during programming and removed from the floating gate during erase through the tunneling oxide region.

An NMOS pass gate transistor 106 has a drain connected to a second terminal of tunneling capacitor 104 to control voltage supplied to capacitor 104. The source of transistor 106 is connected to a word control (WC) node, while its gate is connected to the WL node similar to pass transistor 108.

FIG. 2 shows a cross sectional view of a layout of the NMOS pass transistor 106. As shown, the pass transistor 106 includes n-type source and drain implant regions 202 and 204 provided in a p-type substrate. To isolate the source and drain regions 202 and 204 of transistor 106 from other transistors, field oxide regions 206 and 208 are further implanted in the substrate. To prevent depletion of the channel between the source and drain regions 202 and 204 when an unusually high drain voltage is applied, a punch through implant region 210 is provided in the channel. Further, to provide the NMOS threshold typically found in NMOS transistors, a vt implant region 212 is also provided in the channel between regions 202 and 204.

To further identify the implants utilized in transistor 106, FIG. 3 plots dopant concentration vs. distance from the substrate surface for the punch through, vt, and field implants. As shown in FIG. 3, the implantation energy level of the punch through and vt implants, which is indicated by the distance from the surface of a majority of the dopant concentration, can be less than the implantation energy level for the field implant. Further, as shown, the energy level of the punch through implant is greater than the vt implant.

The appropriate voltages necessary for programming, or adding charge to the floating gate of transistor 100 in FIG. 1 are listed in Table I below.

TABLE I

|  | WC | WL | ACG | PT | PTG |
|---|---|---|---|---|---|
| Program | Vpp | Vpp+ | 0 | Hiz | 0 |

The voltage Vpp indicates a pumped programming voltage which is on the order of 12 volts. As illustrated in FIG. 4, Vpp is provided by voltage pump circuitry 400 on a chip which increases a Vcc voltage supplied externally to the chip. Vcc is on the order of 5 volts. The voltage Vpp+ indicates the programming voltage plus an NMOS threshold, vtn, the total voltage Vpp+ typically being approximately 13.8 volts. As shown in FIG. 4, Vpp+ is provided by an additional voltage pump circuit 402.

During program, the additional NMOS threshold, vtn, above Vpp is required on the WL node to assure transistor 106 turns on. The additional voltage vtn above Vpp is provided by circuitry in voltage pump 402 in addition to the circuitry of voltage pump 400. Because the added voltage pump circuitry in voltage pump 402 typically provides an output through an NMOS transistor, the added circuitry pumps the voltage two times vtn above Vpp to obtain a WL voltage of Vpp+ which is one vtn above Vpp. Typical voltage pump circuitry is described in U.S. Pat. No. 5,263,000 entitled "Drain Power Supply", which is incorporated herein by reference.

SUMMARY OF THE INVENTION

The present invention provides a memory cell for a PLD wherein during programming, pumping voltage above a drain program voltage of Vpp is not required.

The present invention further provides a memory cell which requires less process steps during manufacture than a conventional memory cell.

The present invention is a memory cell for a PLD and a method for programming the memory cell. The memory cell includes components typically found in a memory cell for a PLD including an NMOS transistor having a floating gate, and two capacitors coupled to the floating gate, one capacitor being a tunneling capacitor enabling charge to be added to and removed from the floating gate. The memory cell further includes an NMOS pass gate transistor for supplying charge to the tunneling capacitor, but unlike conventional NMOS pass gates, it has a reduced threshold so that during programming when a programming voltage of Vpp is applied to its drain, it can be turned on with an identical voltage Vpp applied to its gate, rather than requiring that its gate voltage be pumped above an NMOS threshold plus its drain voltage to a voltage Vpp+ during programming.

A reduced threshold can be provided in the NMOS pass gate by removing the vt implant and punch through implant normally provided between the source and drain of the NMOS pass gate. Reducing transistor threshold in this manner reduces processing steps during manufacture. Other ways for reducing the threshold of the NMOS pass gate may also be utilized, such as adding arsenic ion implantation to the channel of the NMOS pass gate.

BRIEF DESCRIPTION OF THE DRAWINGS

Further details of the present invention are explained with the help of the attached drawings in which.

DETAILED DESCRIPTION

Figure 1:
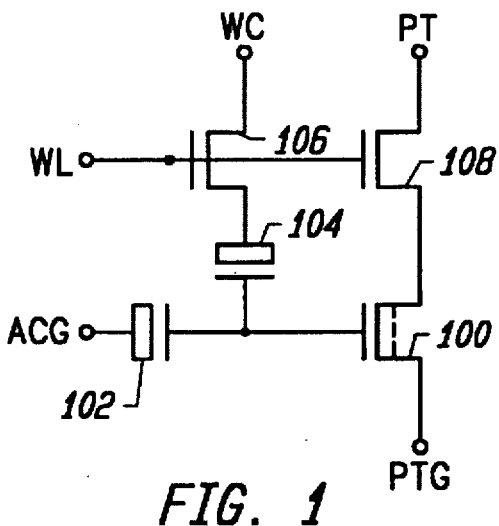
FIG. 1 shows circuitry for a conventional memory cell utilized in a PLD.

The present invention includes an NMOS pass transistor 106 used in the programmable memory cell of FIG. 1. However, unlike the structure previously used for the NMOS pass transistor 106 of FIG. 1, the NMOS pass transistor of the present invention has a reduced threshold to enable the WL voltage during programming to be equal to or less than the WC voltage of Vpp.

Figure 2:
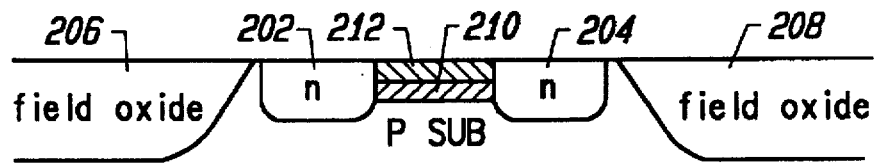
FIG. 2 shows a cross sectional view of the layout of the NMOS pass transistor connected to the tunneling capacitor in the memory cell of FIG. 1.
Figure 3:
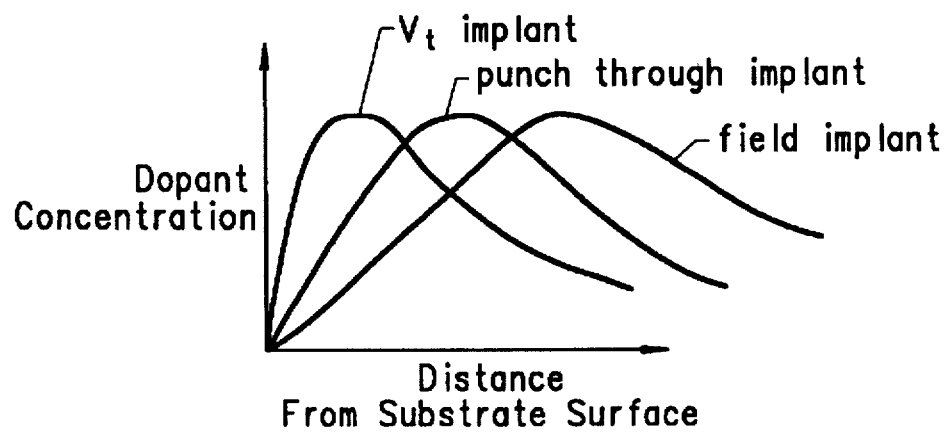
FIG. 3 plots dopant concentration vs. distance from the substrate surface for vt, punch through, and field implants.
Figure 4:
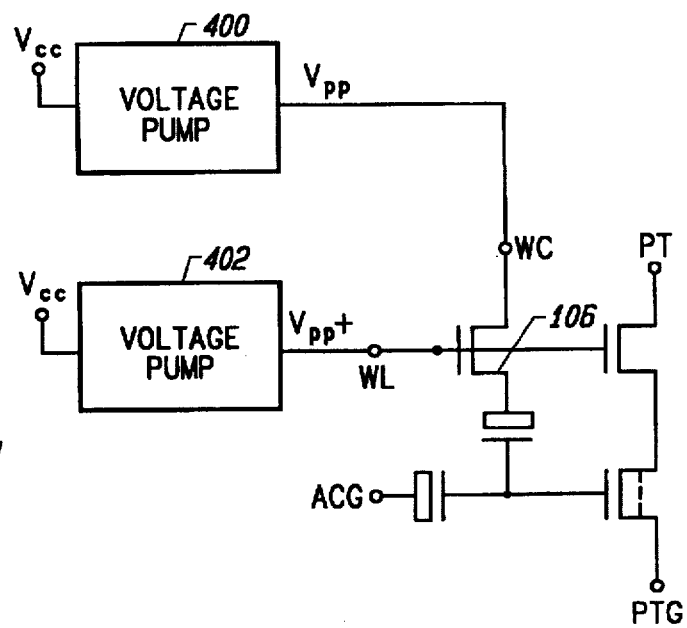
FIG. 4 shows the conventional connection of voltage pump circuitry to the memory cell of FIG. 1 during programming.
Figure 5:
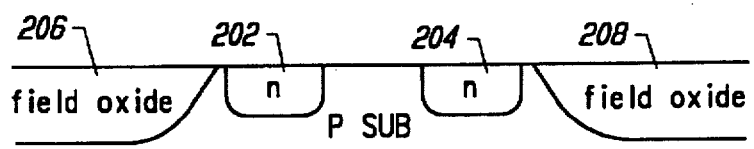
FIG. 5 shows the cross sectional view of the layout of the NMOS pass transistor of FIG. 2 with the punch through and vt implants removed.

The NMOS pass transistor of the present invention may be provided with a reduced threshold in one of several ways. In a first way, illustrated by FIG. 5, the punch through implant 210 and vt implant 212 normally provided between the source and drain of the NMOS pass gate 106, as shown in FIG. 2, are removed. By removing the vt and punch through implants to reduce the threshold of NMOS pass gate 106, processing steps during manufacture are likewise reduced.

By removing only the vt implant, which sets the threshold of the cell, the threshold of transistor 106 reduces to approximately 0.4 volts. Although any slight reduction is desirable to reduce the requirement for additional voltage pump circuitry, it is further desirable to remove the punch through implant to create a threshold of approximately zero volts to remove the requirement for any added voltage pump circuitry.

Figure 6:
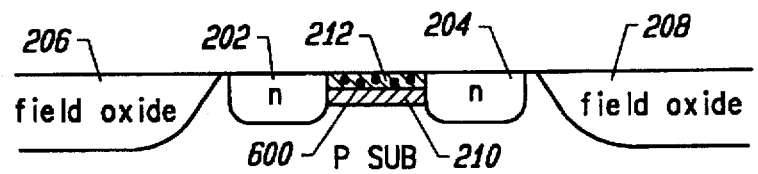
FIG. 6 shows the cross sectional view of the layout of the NMOS pass transistor of FIG. 2 with arsenic ions implanted in its channel.

FIG. 6 shows a second way to reduce the threshold of NMOS pass transistor 106 wherein arsenic ions 600 may be implanted in the channel between the source and drain of transistor 106, similar to transistor 100 of FIG. 1, to reduce its threshold.

Although not shown, other ways which are widely known in the art may also be utilized to reduce the threshold of an NMOS pass transistor. Note that components of the NMOS pass transistor 106 which are described with respect to FIG. 2 and are carried over from FIG. 2 to FIGS. 5 and 6 are labeled with identical reference numbers.

By sufficiently reducing the threshold of transistor 106, voltage applied to the WL node during programming, shown in Table I as Vpp+, can be reduced to Vpp. Therefore, no additional voltage pump circuitry is required to pass the WC program voltage of Vpp to the second terminal of tunneling capacitor 104 during programming.

Figure 7:
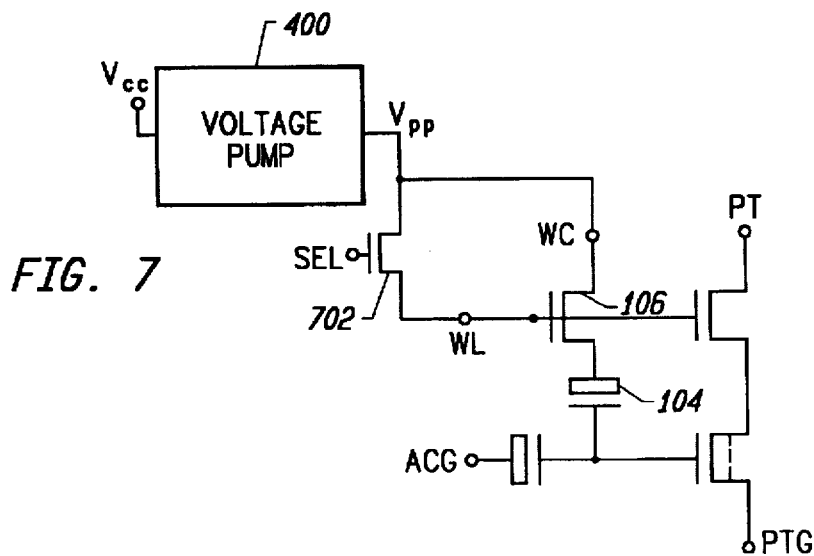
FIG. 7 shows the connection of voltage pump circuitry to the memory cell of the present invention during programming.

FIG. 7 shows a connection of voltage pump circuitry to a memory cell of the present invention during programming. As shown, the additional voltage pump 402 of FIG. 4 which is needed to create the Vpp+ voltage is removed, and the single voltage pump 400 may be used to supply the voltage Vpp to both the WC node and WL node of the NMOS transistor 106. A pass gate 702 is utilized to select the voltage Vpp to a particular cell in an array of cells including transistor 106.

By reducing the threshold of transistor 106, it is typically perceived that a disturb condition may occur with cells in an array which are not to be programmed. For instance, during program of a selected cell, cells connected in the same column will have WC nodes connected together. To assure unselected cells in the same column as the selected cell are not programmed, a WL voltage of zero volts is applied to the unselected cells. In the prior art where transistor 106 has an NMOS threshold above zero volts, applying zero volts to the gate would assure the transistor remained off. With the threshold of transistor 106 being near zero volts in the present invention, a WL voltage equal to zero volts will not completely turn off the transistor 106 in unselected cells. With transistor 106 being on, it is perceived that a leakage current may disturb the programmed state of the floating gate in unselected cells, or overload voltage pump circuitry.

However, by setting limits on the program conditions of floating gates, the user can avoid a disturb condition while using the present invention. For instance, to disturb the program condition of the floating gate, it has been experimentally determined that a total voltage $V_{DISTURB}$ should be less than approximately 6 volts, wherein $V_{DISTURB} = V_{TE} + V_P$, $V_{TE}$ being the voltage on the floating gate, and $V_P$ being the voltage at the source of transistor 106. With the threshold of transistor 106 in unselected cells being reduced to zero volts, and with WL being zero volts in unselected cells, it has been determined that leakage current will create a maximum $V_P$ voltage of 2 volts at the source of transistor 106. Previously, the program state of the common floating gate had a maximum voltage limit for $V_{TE}$ of 6 volts with a tunneling oxide in capacitor 104 having a thickness of 80 Å. With $V_{TE}=6$ volts and $V_P=2$ volts, $V_{DISTURB}$ will be 8 volts, creating a disturb condition above 6 volts, which is above the experimentally determined limit. However, by reducing the maximum allowable program voltage for $V_{TE}$ to 4 volts, no significant disturb will occur.

Although the invention has been described above with particularity, this was merely to teach one of ordinary skill in the art how to make and use the invention. Many modifications will fall within the scope of the invention, as that scope is defined by the claims which follow. For instance, U.S. Pat. No. 5,272,368, incorporated herein by reference, describes a memory cell for a PLD having an NMOS and a PMOS transistor with a common floating gate instead of a floating gate coupled to a single NMOS transistor 100 as shown in FIG. 1. The cell of U.S. Pat. No. 5,272,368 does, however, utilize a tunneling capacitor and an NMOS pass transistor supplying power to the tunneling capacitor, similar to the cell of FIG. 1. Thus, an embodiment of the present invention includes utilizing the technique of reducing the threshold of the NMOS pass transistor connected to the tunneling capacitor in the cell of U.S. Pat. No. 5,272,368 to reduce the required WL voltage during programming to be equal to or less than the WC voltage of Vpp.

What is claimed is:

1. A method of programming a memory cell, the memory cell including an NMOS transistor having a floating gate; a first capacitor having a terminal coupled to the floating gate of the NMOS transistor; a second capacitor having a first terminal, a second terminal coupled to the floating gate, and a tunneling oxide region utilized to add charge to the floating gate during programming; a first NMOS pass gate transistor having a source connected to a drain of the NMOS transistor, and a second NMOS pass gate transistor having a gate connected to a gate of the first NMOS pass gate transistor, a drain, and a source connected to the first terminal of the second capacitor, the method comprising the steps of:

applying a programming voltage Vpp to the drain of the second NMOS pass gate transistor; and applying a voltage equal to or less than the programming voltage Vpp to the gate of the second NMOS pass transistor.

2. A memory cell including art NMOS transistor having a floating gate; a first capacitor having a terminal coupled to the floating gate of the NMOS transistor; and a second capacitor having a first terminal, a second terminal coupled to the floating gate, and a tunneling oxide region utilized to add charge to and subtract charge from the floating gate, the memory cell further comprising:

an NMOS pass gate transistor having a source to drain path connected to the first terminal of the second capacitor, wherein no vt implant and no punch through implant are provided in a substrate between the source and drain of the NMOS pass gate transistor.

* * * * *